United States Patent
Zhang et al.

(10) Patent No.: US 12,402,482 B2
(45) Date of Patent: Aug. 26, 2025

(54) DISPLAY PANEL INCLUDING FLOW GUIDE STRIPS AND DISPLAY DEVICE

(71) Applicant: BOE TECHNOLOGY GROUP CO., LTD., Beijing (CN)

(72) Inventors: Ziyu Zhang, Beijing (CN); Tao Sun, Beijing (CN); Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 900 days.

(21) Appl. No.: 17/331,802

(22) Filed: May 27, 2021

(65) Prior Publication Data
US 2022/0093895 A1    Mar. 24, 2022

(30) Foreign Application Priority Data
Sep. 22, 2020 (CN) .......................... 202011005020.X

(51) Int. Cl.
| | |
|---|---|
| *H10K 50/844* | (2023.01) |
| *H10K 59/122* | (2023.01) |
| *H10K 59/131* | (2023.01) |
| *H10K 71/00* | (2023.01) |

(52) U.S. Cl.
CPC ......... *H10K 50/844* (2023.02); *H10K 59/122* (2023.02); *H10K 59/131* (2023.02); *H10K 71/00* (2023.02)

(58) Field of Classification Search
CPC .. H10K 50/844; H10K 59/131; H10K 59/122; H10K 71/00
USPC ...................................................... 257/40, 59
See application file for complete search history.

(56) References Cited

U.S. PATENT DOCUMENTS

| | | | |
|---|---|---|---|
| 10,269,881 B2* | 4/2019 | Go | .......................... H10K 50/84 |
| 2015/0380685 A1* | 12/2015 | Lee | ...................... H10K 59/122 |
| | | | 257/40 |
| 2016/0035274 A1* | 2/2016 | Kwon | ................... H01L 27/124 |
| | | | 345/82 |
| 2018/0226612 A1* | 8/2018 | Choi | .................. H10K 59/8731 |

(Continued)

FOREIGN PATENT DOCUMENTS

| | | |
|---|---|---|
| CN | 111293145 A | 6/2020 |
| CN | 111554714 A | 8/2020 |

(Continued)

OTHER PUBLICATIONS

Office Action issued on May 25, 2024, in corresponding Chinese patent Application No. 202011005020.X, 14 pages.

*Primary Examiner* — Eric W Jones
(74) *Attorney, Agent, or Firm* — XSENSUS LLP

(57) ABSTRACT

The present disclosure relates to a display panel and a terminal device. The display panel includes a substrate; a driving layer arranged on a side of the substrate; a light-emitting device layer arranged on a side of a pixel circuit area away from the substrate; a first blocking dam arranged on a side of an edge area away from the substrate, the first blocking dam being a ring structure surrounding the peripheral circuit area; a plurality of flow guide strips arranged in a range surrounded by the first blocking dam, each of the flow guide strips extending from the edge area to the peripheral circuit area; and an encapsulation layer including a first inorganic layer, an organic layer and a second inorganic layer. The organic layer is defined in the range surrounded by the first blocking dam.

18 Claims, 10 Drawing Sheets

(56) References Cited

U.S. PATENT DOCUMENTS

| | | | |
|---|---|---|---|
| 2019/0221625 A1* | 7/2019 | Go | H10K 59/122 |
| 2019/0288234 A1* | 9/2019 | Kim | H10K 59/131 |
| 2020/0185647 A1* | 6/2020 | Lee | H10K 59/122 |

FOREIGN PATENT DOCUMENTS

| | | |
|---|---|---|
| CN | 111564568 A | 8/2020 |
| CN | 212967754 U | 4/2021 |

* cited by examiner

DISPLAY PANEL INCLUDING FLOW GUIDE STRIPS AND DISPLAY DEVICE

CROSS-REFERENCE TO RELATED APPLICATION

This application is based upon, and claims the benefit of and priority to, Chinese Application No. 202011005020.X, filed Sep. 22, 2020, the entire contents of which are incorporated herein by reference.

TECHNICAL FIELD

The present disclosure relates to display technologies and, in particular, to a display device and a display panel.

BACKGROUND

In an organic light-emitting diode (OLED) display panel, a thin-film encapsulation (TFE) process is usually used for encapsulation. However, optical uniformity of an encapsulation layer of the existing display panel is low, and the effect of blocking water and oxygen still needs to be improved.

It should be noted that the information disclosed in the Background section above is only for enhancing the understanding of the background of the present disclosure, and thus may include information that does not constitute prior art known to those of ordinary skill in the art.

SUMMARY

Embodiments of the present disclosure provide a display device and a display panel.

According to an aspect of the present disclosure, there is provided a display panel, including:

a substrate;

a driving layer arranged on a side of the substrate, and having a pixel circuit area, a peripheral circuit area surrounding the pixel circuit area, and an edge area surrounding the peripheral circuit area;

a light-emitting device layer arranged on a side of the pixel circuit area away from the substrate;

a first blocking dam arranged on a side of the edge area away from the substrate, the first blocking dam being a ring structure surrounding the peripheral circuit area;

a plurality of flow guide strips arranged on a side of the edge area away from the substrate and located in a range surrounded by the first blocking dam, wherein the plurality of flow guide strips are distributed at intervals, and each of the flow guide strips extends from the edge area to the peripheral circuit area; and an encapsulation layer including a first inorganic layer, an organic layer and a second inorganic layer, wherein:

the first inorganic layer covers the light-emitting device layer, the first blocking dam and the flow guide strips, and protrudes at an area corresponding to the first blocking dam and the flow guide strips;

the organic layer is provided on a surface of the first inorganic layer away from the substrate, and is defined in the range surrounded by the first blocking dam; and the second inorganic layer covers the organic layer and the first inorganic layer.

According to an exemplary embodiment of the present disclosure, the flow guide strips are connected to an inner side wall of the first blocking dam, and a thickness of the flow guide strips is smaller than a thickness of the first blocking dam in a direction perpendicular to the substrate.

According to an exemplary embodiment of the present disclosure, the first blocking dam includes a first layer and a second layer sequentially stacked in a direction away from the substrate, an inner sidewall of the second layer surrounds an inner side wall of the first layer and is outward more than the inner side wall of the first layer, the flow guide strips are connected with the first layer and a material of the flow guide stripes is the same as a material of the first layer.

According to an exemplary embodiment of the present disclosure, there is a gap between an inner side wall of the first blocking dam and the flow guide strips.

According to an exemplary embodiment of the present disclosure, an orthographic projection of the edge area on the substrate is a polygon, and the edge area includes a plurality of side areas and arc areas, and two adjacent side areas are connected by one of the arc areas;

wherein flow guide strips located in the arc areas have a width which is increased along a direction away from the pixel circuit area.

According to an exemplary embodiment of the present disclosure, the driving layer includes:

an active layer provided on a side of the substrate and located in the pixel circuit area and the peripheral circuit area;

a first gate insulating layer covering the active layer and located in the pixel circuit area, the peripheral circuit area and the edge area;

a gate electrode layer provided on a surface of the first gate insulating layer away from the substrate, and located in the pixel circuit area and the peripheral circuit area;

a second gate insulating layer covering the gate electrode layer and the first gate insulating layer and located in the pixel circuit area, the peripheral circuit area and the edge area;

a dielectric layer covering the second gate insulating layer and located in the pixel circuit area, the peripheral circuit area and the edge area;

a source and drain layer provided on a surface of the dielectric layer away from the substrate and located in the pixel circuit area and the peripheral circuit area;

a planarization layer covering the source and drain layer and the dielectric layer, and located in the pixel circuit area and the peripheral circuit area;

a power line provided on a surface of the dielectric layer away from the substrate and located in the edge area, wherein a material and a thickness of the power line are the same as a material and a thickness of the source and drain layer, respectively;

wherein the first blocking dam and the flow guide strips cover at least a part of the power line.

According to an exemplary embodiment of the present disclosure, the light-emitting device layer includes:

a first electrode layer arranged on a surface of the planarization layer away from the substrate and located in the pixel circuit area, wherein the first electrode layer includes a plurality of first electrodes distributed in an array;

a pixel define layer covering the first electrode layer and the planarization layer, and exposing each of the first electrodes;

a light-emitting functional layer covering at least surfaces of the first electrodes away from the substrate;

a second electrode layer covering the light-emitting functional layer.

According to an exemplary embodiment of the present disclosure, wherein the display panel further includes:

a lap layer arranged on a surface of the planarization layer away from the substrate and extending to a surface of the power line away from the substrate, wherein an area of the lap layer corresponding to the planarization layer is provided with a plurality of vent holes distributed in an array, and a material and a thickness of the lap layer are the same as a material and a thickness of the first electrode layer, respectively; and a protective layer arranged on a surface of the lap layer away from the substrate, covering the vent holes, and exposing a part of the lap layer, wherein a material and a thickness of the protective layer are the same as a material and a thickness of the flow guide strips, respectively;

wherein the flow guide strips are located on a side of the protective layer away from the pixel circuit area, and cover a part of the lap layer corresponding to the power line;

wherein the second electrode layer extends toward the edge area to a surface of the protective layer away from the substrate, and is connected to the lap layer.

According to an exemplary embodiment of the present disclosure, the protective layer includes a plurality of protective strips, the vent holes are distributed in an area where the lap layer is covered by the protective strips, and the protective strips are connected to the flow guide strips in a one-to-one correspondence.

According to an exemplary embodiment of the present disclosure, the display panel further includes:

a supporting pillar arranged on a surface of the pixel define layer away from the substrate;

wherein one of the supporting pillar and the pixel define layer is made of a same material as the flow guide strips.

According to an exemplary embodiment of the present disclosure, the display panel further includes:

a second blocking dam arranged on a side of the edge area away from the substrate and arranged around the first blocking dam, wherein the first inorganic layer covers the second blocking dam.

a distance between an inner side wall of the second layer and an inner side wall of the first layer is not smaller than 3 μm.

According to an exemplary embodiment of the present disclosure, a width of the gap between the inner side wall of the first blocking dam and the flow guide strips is 3 μm-30 μm.

According to an exemplary embodiment of the present disclosure, a length of each of the flow guide strips is 50 μm-500 μm, a width of each of the flow guide strips is 5 μm-50 μm, and a distance between two adjacent flow guide strips is 5 μm-100 μm.

According to an exemplary embodiment of the present disclosure, the flow guide strips are distributed at intervals along a ring trajectory.

According to another aspect of the present disclosure, there is provided a display device, including the display panel according to any one of the above embodiments.

It should be understood that the above general description and the following detailed description are only exemplary and explanatory, and should not be considered as constituting any limitations on the present disclosure.

BRIEF DESCRIPTION OF THE DRAWINGS

The drawings, which are incorporated into the specification and constitute a part of the specification, show embodiments in accordance with the disclosure, and are used to explain the principles of the disclosure together with the specification.

DETAILED DESCRIPTION

Figure 1:
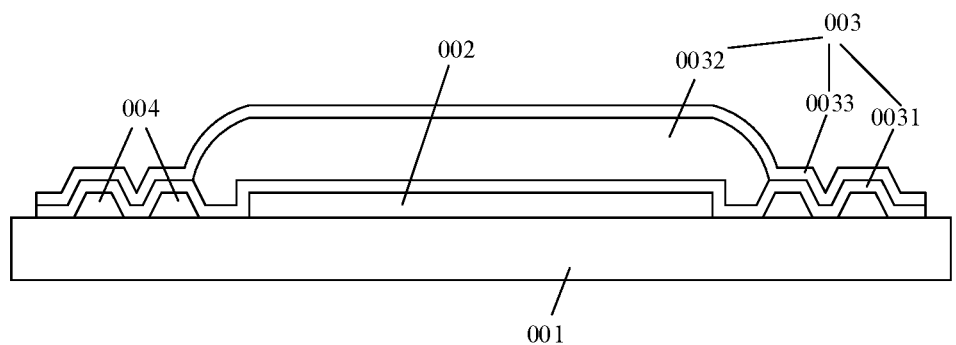
FIG. 1 is a schematic diagram showing encapsulation of a display panel in a related art.

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

The terms "a", "an", "the", "said" and "at least one" are used to indicate the presence of one or more elements/components, and so on; the terms "include" and "have" are open terms and means inclusive, and refers to that in addition to the listed elements/components and so on, there may be other elements/components and so on. The terms "first", "second", and so on are only used as marks, and should not be considered as constituting any limitations on the number of objects.

Figure 2:
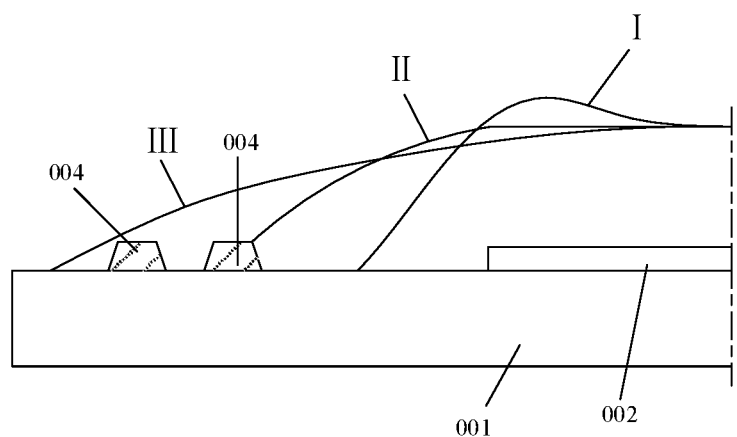
FIG. 2 is a partial cross-sectional view showing an organic material distribution in an encapsulation layer of a display panel in the related art.
Figure 3:
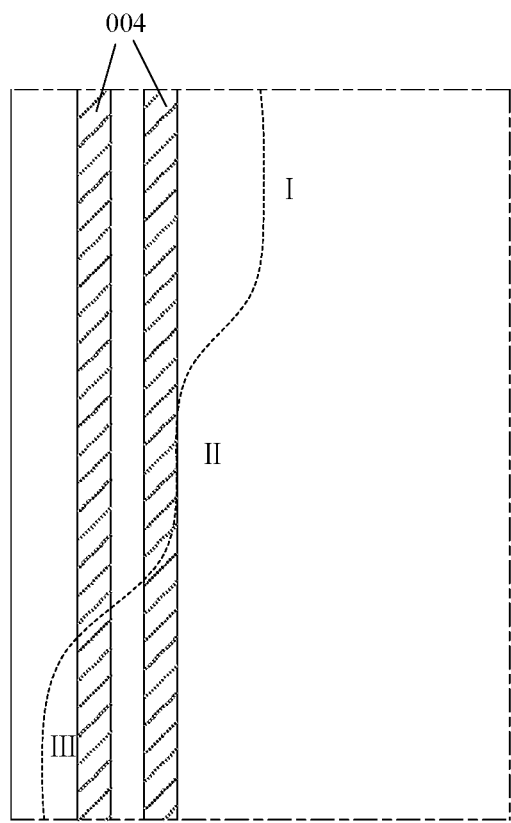
FIG. 3 is a partial top view of the organic material distribution in the encapsulation layer of the display panel in the related art.

Listing of reference signs in FIGS. 1 to 3: 001, driving backplane; 002, light-emitting device layer; 003, encapsulation layer; 0031, first inorganic layer; 0032, organic layer; 0033, second inorganic layer; and 004, blocking dam.

Listing or reference signs in FIGS. 4 to 12: 1, substrate; 2, driving layer; 201, pixel circuit area; 202, peripheral circuit area; 203, edge area; 2031, side area; 2032, arc area; 21, active layer; 211, active portion; 22, first gate insulating layer; 23, gate electrode layer; 231, gate electrode; 24, second gate insulating layer; 25, dielectric layer; 26, source and drain layer; 261, source electrode; 262, drain electrode; 27, planarization layer; 28, power line; 291, first plate; 292, second plate; 293, third plate; 294, fourth plate; 3, light-emitting device layer 31, first electrode layer; 311, first electrode; 32, pixel define layer; 33, light-emitting functional layer; 331, organic common layer; 332, light-emitting material layer; 34, second electrode layer; 4, first blocking dam; 41, first layer of the first blocking dam; 42, second layer of the first blocking dam; 5, flow guide strip; 6, encapsulation layer; 61, first inorganic layer; 62, organic layer; 63, second inorganic layer; 7, lap layer; 71, vent holes; 8, protective layer; 81, protective strip; 9, supporting pillar; 10, second blocking dam; 101, the first layer of the second blocking dam; 102, the second layer of the second blocking dam; 103, the third layer of the second blocking dam; and 11, buffer layer.

In the related art, as shown in FIG. 1, an OLED display panel may include a driving backplane 001, a light-emitting device layer 002, an encapsulation layer 003, and a plurality of ring-shaped blocking dams 004 arranged concentrically that are provided on one side of the driving backplane 001. The light-emitting device layer 002 is arranged on the driving backplane 001 and is located in the range surrounded by the blocking dam 004, and light-emitting devices in the light-emitting device layer 002 can be driven to emit light by circuits in the driving backplane 001, thereby displaying images.

The encapsulation layer 003 may include a first inorganic layer 0031, an organic layer 0032, and a second inorganic layer 0033. The first inorganic layer 0031 covers the blocking dam 004 and the light-emitting device layer 002. The organic layer 0032 is provided on a surface of the first inorganic layer 0031 away from the backplane 001, and is limited to the range surrounded by the blocking dams 004 (the one closest to the light-emitting device layer 002 among the blocking dams 004). The second inorganic layer 0033 covers the organic layer 0032 and the first inorganic layer 0031 and accordingly, the organic layer 0032 is sandwiched and enclosed between the first inorganic layer 0031 and the second inorganic layer 0033. The first inorganic layer 0031 and the second inorganic layer 0033 are made of inorganic materials that can be used to block water. The material of the organic layer 0032 is an organic material, which can play a role of flattening interface, covering defects, and relieving stress.

When packaging, organic materials can be formed on the first inorganic layer 0031 through an Inkjet-printed (IJP) process, and the blocking dams 004 prevent the organic material from overflowing outside the blocking dams 004, thereby preventing the organic material from contacting outside water and oxygen. During this process, the liquid organic material flows freely on the first inorganic layer 0031. Due to the influence of local wettability and liquid surface tension fluctuations, the actual stop positions of the organic material in different areas vary greatly, that is, the edge linearity is poor. In other words, the boundaries of the organic layer 0032 in different regions are difficult to match the range defined by the blocking dams 004.

As shown in FIGS. 2 and 3, the ideal edge of the organic layer 0032 is the region II, that is, the inner side of the blocking dams 004 is filled with the organic material without overflow. However, since the actual stop positions of organic material is difficult to control, problems of insufficient coverage or overflow are prone to occur. Specifically, in FIG. 2 and FIG. 3, the leveling distance in region I is insufficient, that is, the boundary of the organic material does not reach the blocking dams 004, resulting in a part of the area inside the blocking dam 004 not being covered by the organic layer 0032, and a relatively large slope being prone to appear in region I, causing subsequent process risks, and pressing internal organic materials to form bumps on the light-emitting device layer 002 which affects optical uniformity. In region III, the organic material overflows and flows out of the blocking dams 004, which makes organic layer 0032 be exposed to the outside and is prone to contact with water and oxygen, resulting in package failure.

Embodiments of the present disclosure provide a display panel, which may be an OLED display panel, for example. As shown in FIGS. 4 to 7, the display panel may include a substrate 1, a driving layer 2, a light-emitting device layer 3, a first blocking dam 4, flow guide strips 5, and an encapsulation layer 6.

The driving layer 2 is provided on a side of the substrate 1 and has a pixel circuit area 201, a peripheral circuit area 202 surrounding the pixel circuit area 201, and an edge area 203 surrounding the peripheral circuit area 202.

The light-emitting device layer 3 is provided on aside of the pixel circuit area 201 away from the substrate 1.

The first blocking dam 4 is provided on a side of the edge area 203 away from the substrate 1, and the first blocking dam 4 is a ring structure surrounding the pixel circuit region 201.

A plurality of flow guide strips 5 are arranged on a side of the edge area 203 away from the substrate 1 and located in the range surrounded by the first blocking dam 4. The flow guide strips 5 are distributed at intervals, and each flow guide strip 5 extends from the edge area 203 to the peripheral circuit area 202.

For example, the flow guide strips 5 are distributed at intervals along a ring trajectory.

The encapsulation layer 6 includes a first inorganic layer 61, an organic layer 62, and a second inorganic layer 63. The first inorganic layer 61 covers the light-emitting device layer 3, the first blocking dam 4, and the flow guide strips 5, and protrudes at an area corresponding to the first blocking dam 4 and the flow guide strips 5. The organic layer 62 is provided on a surface of the first inorganic layer 61 away from the substrate 1, and is limited to the range surrounded by the first blocking dam 4. The second inorganic layer 63 covers the organic layer 62 and the first inorganic layer 61.

In the display panel according to embodiments of the present disclosure, flow guide strips extending from the edge area to the peripheral circuit area are arranged at the inner side of the first blocking dam, and the first inorganic layer protrudes in an area corresponding to the first blocking dam and the flow guide strips. When the organic layer 62 is formed, the protrusions corresponding to the flow guide strips 5 will destroy the equilibrium state of the surface tension of the liquid organic material. Under the action of the capillary effect, the organic materials diffuse along the protrusions corresponding to the flow guide strips 5 toward the first blocking dam, until organic materials are blocked by the protrusion corresponding to the first blocking dam. The display panel according to embodiments of the present disclosure can make the boundary of the organic layer 62 match the range defined by the first blocking dam 4, and the problem of insufficient organic material coverage and overflow (across the first blocking dam) will not occur. The insufficient organic material coverage in the edge area 203 can easily cause accumulation of the organic materials in the peripheral circuit area 202 or the pixel circuit area 201, which increases the risk of subsequent processes and leads to insufficient luminescence uniformity. The overflow of organic materials can make organic materials come into contact with external water and oxygen, resulting in encapsulation failure. In summary, the display panel according to embodiments of the present disclosure can improve the luminescence uniformity, reduce process risks, and prevent encapsulation failure.

Hereinafter, members of the display panel according to embodiments of the present disclosure will be described in detail.

The substrate 1 can have a transparent plate-like structure, and the material of the substrate 1 can be a flexible material such as polyimide (PI). Correspondingly, the display panel may be a flexible display panel. According to some other embodiments, the material of the substrate 1 can be a hard material such as glass.

The driving layer 2 is provided on a side of the substrate 1. In order to prevent impurities in the substrate 1 from affecting the driving layer 2, a buffer layer 11 can be provided on the substrate 1 and the driving layer 2 is provided on a surface of the buffer layer 11 away from the substrate 1.

The driving layer 2 has a pixel circuit area 201, a peripheral circuit area 202 surrounding the pixel circuit area 201, and an edge area 203 surrounding the peripheral circuit area 202. The pixel circuit area 201 is provided with a pixel circuit, and the specific structure of the pixel circuit is not particularly limited herein, as long as it can be used to drive light emitting devices of the light emitting device layer 3 to emit light. Peripheral circuits are provided in the peripheral circuit area 202, and driving signals can be input to the pixel circuit through the peripheral circuit to make the light-emitting devices of the light-emitting device layer 3 emit light. The peripheral circuits may include a light-emitting control circuit (EM-GOA), a gate drive circuit (Gate-GOA), etc., and the specific configuration of the peripheral circuits are not specifically limited here.

Figure 5:
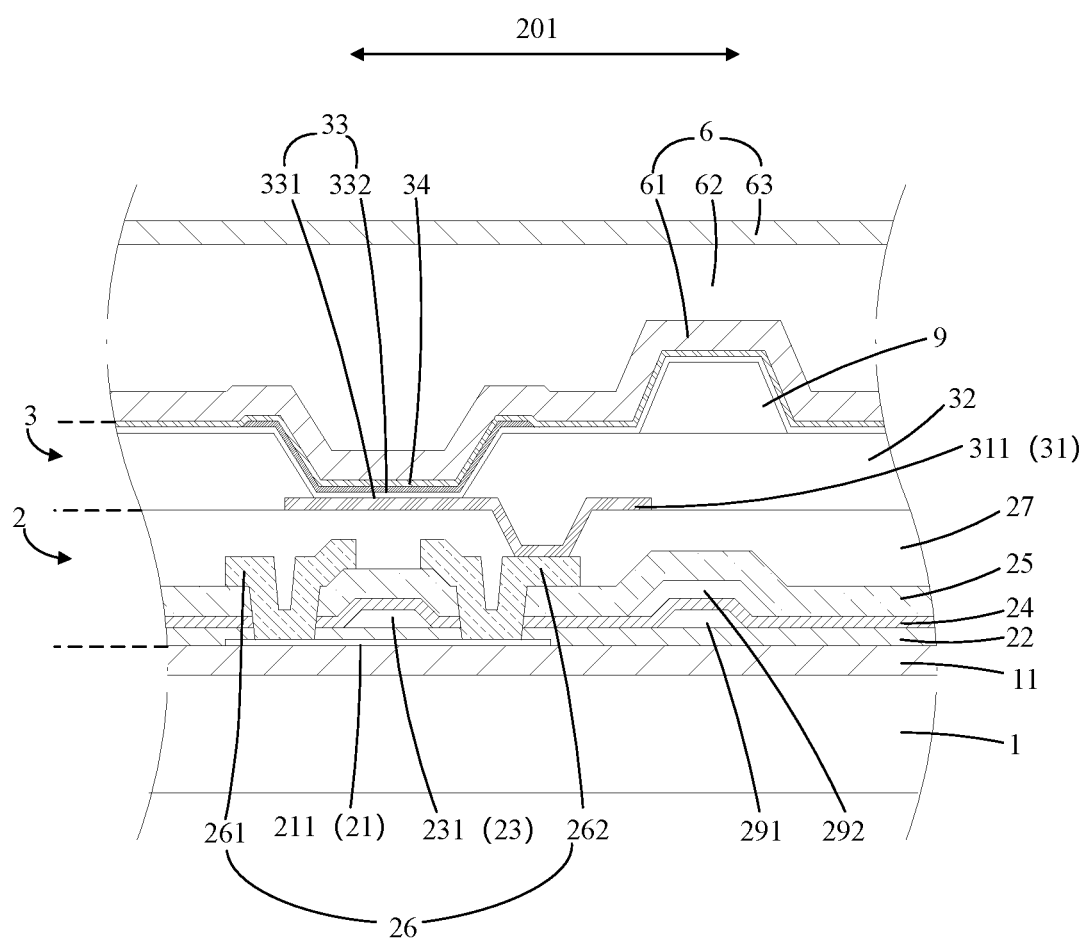
FIG. 5 is a cross-sectional view of the display panel taken along A-A in FIG. 4.

In some embodiments of the present disclosure, both the pixel circuit and the peripheral circuits of the driving layer 2 include a plurality of thin film transistors, as shown in FIG. 5, FIG. 6, FIG. 8, and FIG. 10. FIG. 5 only shows a driving thin film transistor, and FIG. 6, FIG. 8, and FIG. 10 further show a thin film transistor in the light-emitting control circuit in the peripheral circuits. For example, all thin film transistors have a top gate structure. As shown in FIG. 5, in a direction perpendicular to the driving layer 2, the driving layer 2 may include an active layer 21, a first gate insulating layer 22, a gate electrode layer 23, a second gate insulating layer 24, a dielectric layer 25, a source and drain layer 26, and a planarization layer 27.

The active layer 21 is provided a side of the substrate 1, for example, the active layer 21 is provided on a surface of the buffer layer 11 away from the substrate 1. The active layer 21 is made of semiconductor materials such as amorphous silicon, polysilicon, or metal oxide. The active layer 21 may include a plurality of independent active portions 211, and the active portions 211 are formed in areas in the pixel circuit area 201 and the peripheral circuit area 202 corresponding to respective thin film transistors.

The first gate insulating layer 22 covers the active layer 21, for example, covers the active layer 21 and the buffer layer 11 not covered by the active layer 21. Further, the first gate insulating layer 22 extends to the pixel circuit area 201, the peripheral circuit area 202, and the edge area 203, that is, the orthographic projection of the first gate insulating layer 22 on the substrate 1 can coincide with the boundary of the substrate 1.

The gate electrode layer 23 may be provided on a surface of the first gate insulating layer 22 away from the substrate 1 and located in the pixel circuit area 201 and the peripheral circuit area 202. The gate electrode layer 23 may include a plurality of independent gate electrodes 231, and the regions in the pixel circuit area 201 and the peripheral circuit area 202 corresponding to the thin film transistors are all provided with the gate electrodes 231. The gate electrode 231 and the active portion 211 of the same thin film transistor are arranged directly opposite to each other in the direction perpendicular to the substrate 1.

The second gate insulating layer 24 covers the gate electrode layer 23 and an area of the first gate insulating layer 22 that is not covered by the gate electrode layer 23. The pixel circuit area 201, the peripheral circuit area 202, and the edge area 203 all have the second gate insulating layer 24, that is, the orthographic projection of the second gate insulating layer 24 on the substrate 1 can coincide with the boundary of the substrate 1.

The dielectric layer 25 covers the second gate insulating layer 24. The pixel circuit area 201, the peripheral circuit area 202, and the edge area 203 all have the dielectric layer 25, that is, the orthographic projection of the dielectric layer 25 on the substrate 1 can coincide with the boundary of the substrate 1.

The source and drain layer 26 is provided on a surface of the dielectric layer 25 away from the substrate 1. The source and drain layer 26 includes multiple sets of independent source electrodes 261 and drain electrodes 262. Areas of the pixel circuit area 201 and the peripheral circuit area 202 corresponding to each thin film transistor is provided with a set of source electrode 261 and drain electrode 262. Each set of source electrode 261 and drain electrode 262 includes one source electrode 261 and one drain electrode 262. The same thin film transistor includes a set of source electrode 261 and a drain electrode 262, and the source electrode 261 and the drain electrode 262 are connected to two ends of a corresponding active portion 211.

The material of the planarization layer 27 can be an organic insulating material, which can cover the source and drain layer 26 and an area of the dielectric layer 25 not covered by the source and drain layer 26, and the planarization layer 27 is continuously arranged in the pixel circuit area 201 and the peripheral circuit area 202, the edge area 203 has at most only a part of the planarization layer 27, that is, the boundary of the planarization layer 27 coincides with the boundary of the peripheral circuit region 202; or the boundary of the planarization layer 27 may be located in the edge area 203.

Figure 6:
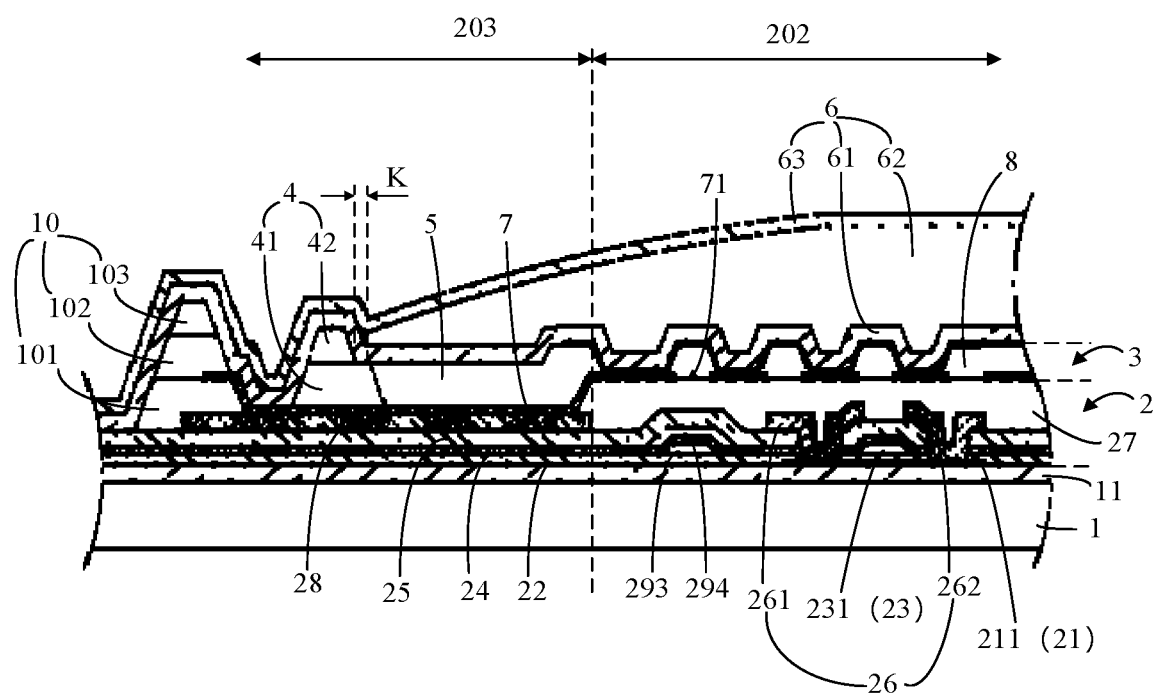
FIG. 6 is a cross-sectional view of the display panel taken along B-B in FIG. 4 according to an embodiment of the present disclosure.

In addition, as shown in FIGS. 5 and 6, the driving layer 2 may further include a power line 28, which may be provided on a surface of the dielectric layer 25 away from the substrate 1 and located in the edge area 203. That is, the power supply line 28 is provided on a surface of the dielectric layer 25 not covered by the planarization layer 27. The material and thickness of the power line 28 and are the same as the material and thickness of the source and drain layer 26, respectively, so that the same patterning process can be used to form the power line 28 and the source and drain layer 26 at the same time. The patterning process can be a photolithography process. In addition, the power line 28 and the peripheral circuits of the peripheral circuit area 202 are separated by a partial area of the planarization layer 27, so that the power line 28 is not directly connected to the peripheral circuits.

The planarization layer 27 can also extend into the edge area 203 and cover a part of the power line 28. The power line 28 may be connected to a driving circuit board bound to a binding area of the edge area 203, and may receive a driving signal from the driving circuit board, so as to drive the light emitting devices of the light emitting device layer 3 to emit light.

As shown in FIG. 5, the pixel circuit of the pixel circuit area 201 may further include a first capacitor. The first capacitor includes a first plate 291 and a second plate 292. The first electrode plate 291 can be provided on a surface of the first gate insulating layer 22 away from the substrate 1 and is covered by the second gate insulating layer 24. The material and thickness of the first gate 291 are the same as the material and thickness of the gate electrode layer 21, respectively, so that the gate electrode layer 21 and the first plate 291 can be formed at the same time through one patterning process. The second electrode plate 292 may be arranged on a surface of the second gate insulating layer 25 away from the substrate 1 and covered by the dielectric layer 25.

Figure 8:
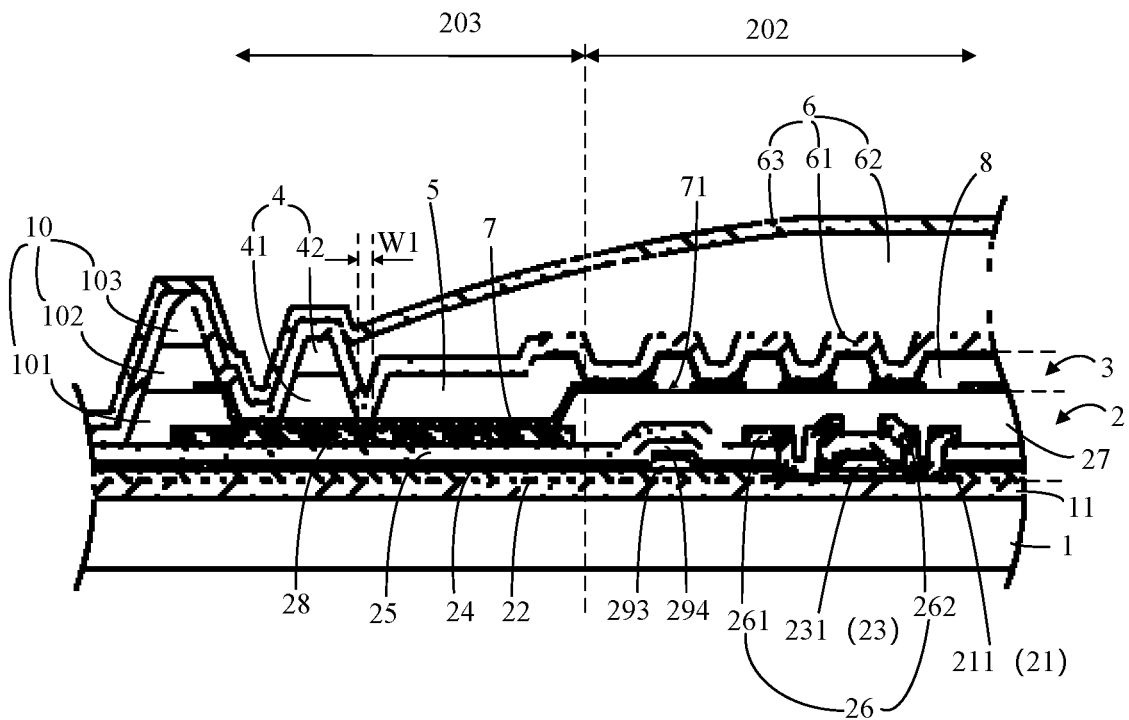
FIG. 8 is a cross-sectional view of the display panel taken along B-B in FIG. 4 according to another embodiment of the present disclosure.
Figure 10:
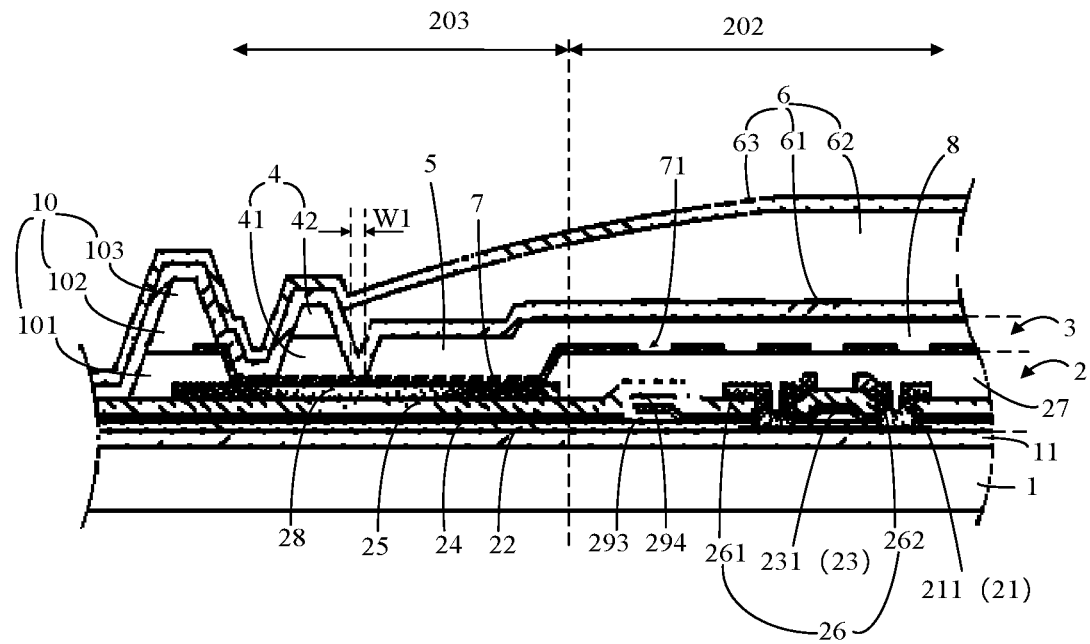
FIG. 10 is a cross-sectional view of the display panel taken along B-B in FIG. 4 according to another embodiment of the present disclosure.

As shown in FIGS. 6, 8, and 10, the peripheral circuit of the peripheral circuit area 202 includes a second capacitor. The second capacitor may include a third plate 293 and a fourth plate 294. The third plate 293 can be provided on a surface of the first gate insulating layer 22 away from the substrate 1 and covered by the second gate insulating layer 24. The material and thickness of the third plate 293 are the same as the material and thickness of the gate electrode layer 21, respectively, and thus the gate electrode layer 21 and the third plate 293 can be formed at the same time through one patterning process. The fourth plate 294 may be provided on a surface of the second gate insulating layer 25 away from the substrate 1 and covered by the dielectric layer 25. The material and thickness of the fourth plate 294 are the same as the material and thickness of the second plate 292, and thus the fourth plate 294 and the second plate 292 may be formed at the same time through one patterning process.

It should be noted that the first capacitor shown in FIG. 5 is used only for illustrating the structure of the first capacitor, and does not refer to a specific capacitor in the pixel circuit. The second capacitor in FIG. 6, FIG. 8 and FIG. 10 is used only for illustrating the structure of the second capacitor, and does not refer to a specific capacitor in the peripheral circuit.

As shown in FIG. 5, the light-emitting device layer 3 may include multiple light-emitting devices. For example, the light-emitting devices are OLED devices. As shown in FIG. 5, in some embodiments of the present disclosure, the light-emitting device layer 3 may include a first electrode layer 31, a pixel define layer 32, a light-emitting functional layer 33 and a second electrode layer 34.

The first electrode layer 31 is provided on a surface of the planarization layer 27 away from the substrate 1 and located in the pixel circuit area 201. The first electrode layer 31 includes a plurality of first electrodes 311 distributed in an array. Each first electrode 311 can be used as an anode of a light-emitting device, and can be connected to the pixel circuit in the pixel circuit area 201 so as to receive a signal for driving the light-emitting device to emit light. For example, the pixel circuit may include pixel circuit units corresponding to the light-emitting devices one by one, and each pixel circuit unit includes a driving transistor, and the source electrode 261 or the drain electrode 262 of the driving transistor is connected to the first electrode 311 of a corresponding light-emitting device through a via hole passing through the planarization layer 27.

The pixel define layer 32 covers the first electrode layer 31 and the planarization layer 27. The pixel define layer 32 is provided with a plurality of openings, and the openings expose the first electrodes 311 in a one-to-one correspondence, so that the range of each light-emitting device can be defined by the pixel define layer 32.

The light-emitting functional layer 33 covers at least a surface of the first electrode 311 away from the substrate 1. For example, the light-emitting functional layer 33 may include a hole injection layer, a hole transport layer, a light-emitting material layer, an electron transport layer, and an electron injection layer that are sequentially stacked in a direction away from the substrate 1. The OLED devices of different colors can at least share the same electron transport layer and the same hole transport layer, but the light-emitting material layers of OLED devices of different colors are different. Therefore, for all OLED devices, the light-emitting functional layer 33 may at least include an organic common layer 331 and a light-emitting material layer 332. The organic common layer 331 is used to represent the film layers shared by the OLED devices, and the number of the light-emitting material layers 332 is multiple and the light-emitting material layers 332 are distributed in an array. The light-emitting material layers 332 are arranged in a one-to-one correspondence with the first electrodes 311 to limit the light-emitting color of the OLED devices.

It should be noted that although the organic common layer 331 in FIG. 5 is depicted as a film layer located between the first electrode layer 31 and the light-emitting material layer 332, the organic common layer 331 is not used to represent an actual layer existing in the light-emitting functional layer 33, but the organic common layer 331 is used to mean all films or layers shared by the OLED devices. If the organic common layer 331 is depicted as a plurality of film layers actually included in the light-emitting functional layer 33, for example, the organic common layer 331 includes an electron transport layer and a hole transport layer, the light-emitting material layer 332 can be located between the electron transport layer and the hole transport layer. That is to say, the organic common layer 331 and the light-emitting material layer 332 in FIG. 5 do not constitute a limitation on the stacking relationship of films and layers that actually exists in the OLED devices.

The second electrode layer 34 covers the light-emitting functional layer 33 and can serve as the cathode of the light-emitting devices, that is, the light-emitting devices can share the second electrode layer 34. Each first electrode 311 and its corresponding light-emitting functional layer 33 and second electrode layer 34 can constitute an OLED light-emitting device. By applying driving signals to the first electrode layer 31 and the second electrode layer 34, the light-emitting functional layer 33 can emit light.

Further, the light-emitting functional layer 33 may further include an optical adjustment layer (not shown in the figures), which may be provided on a surface of the second electrode layer 34 away from the substrate 1. By setting the refractive index of the optical adjustment layer appropriately, the reflection effect of the second electrode layer 34 on the light emitted by the light-emitting material layer 332 can be reduced so as to improve the light extraction efficiency.

Further, as shown in FIGS. 6, 8 and 10, in order to facilitate the connection of the second electrode layer 34 with the power line 28 to input signals to the second electrode layer 34, the display panel may further include a lap layer 7 and a protective layer 8.

The lap layer 7 is made of a conductive material and is provided on a surface of the planarization layer 27 away from the substrate 1 and extends to a surface of the power line 28 away from the substrate 1. However, it is not required that the lap layer 7 completely covers the power line 28 as long as the lap layer 7 can be connected to the power line 28. The lap layer 7 and the power line 28 are connected with each using their overlapping parts. In other words, the lap layer 7 and the power line 28 at least partially overlaps with each other so that the lap layer 7 can be connected to the power line 28. The material and thickness of the lap layer 7 are the same as the material and thickness of the first electrode layer 31, respectively, and thus the lap layer 7 and the first electrode layer 31 can be formed at the same time through the same patterning process, but the lap layer 7 and the first electrode layer 31 are not directly connected with each other. In the direction perpendicular to the substrate 1, the peripheral circuit of the peripheral circuit area 202 may be opposite to the lap layer 7, for example, the lap layer 7 may be directly opposite to the light-emitting control circuit. As shown in FIG. 6, FIG. 8 and FIG. 10, a thin film transistor in the light-emitting control circuit among the peripheral circuits is directly opposite to the lap layer 7.

The planarization layer 27 is an organic material, which is easy to absorb water, and the light-emitting functional layer 33 of the light-emitting device layer 3 can be formed by an evaporation process. In order to discharge water vapor, before the light-emitting layer 3 is formed and after the lap layer 7 and the first electrode layer 31 are formed, baking is performed, and a plurality of vent holes 71 distributed in an array are provided in an area of the lapping layer 7 corresponding to the planarization layer 27 to prevent the lap layer 7 from blocking the release of water vapor.

In order to prevent burrs on the edges of the vent holes 71 from damaging upper film layers, the vent holes 71 can be covered with the protective layer 8 so that the edges of the vent holes 71 are located within the coverage of the protective layer 8, thereby preventing the burrs from affecting the upper layers. Specifically, the protective layer 8 is provided on a surface of the lap layer 7 away from the substrate 1, and covers the vent holes 71, and exposes a part of the lap layer 7. The second electrode layer 34 can extend to the edge area 203 and to the surface of the protective layer 8 away from the substrate 1 and is connected to the lap layer 7 not covered by the protective layer 8, so that the second electrode layer 33 is connected to the power line 28 through the lap layer 7, so as to input signals to the second electrode layer 34.

For example, the protective layer 8 may include a plurality of protective units distributed in an array, and the protective units cover the vent holes 71 in a one-to-one correspondence. The edge of each vent hole 71 is located within the range of the orthographic projection of a corresponding protective unit on the lap layer 7, and the protective unit fills the corresponding vent hole 71.

As shown in FIGS. 6 to 11, the first blocking dam 4 is provided in the edge area 203 and on a side of the driving layer 2 away from the substrate 1. For example, the first blocking dam 4 can be provided on a surface of the dielectric layer 25 away from the substrate 1 and located in the edge area 203. The first blocking dam 4 can cover an area of the power line 28 not covered by the lap layer 7 and a part of the lap layer 7. The first blocking dam 4 is a ring structure surrounding the peripheral circuit area 202 and is used to restrict the organic layer 62 of the encapsulation layer 6.

The first blocking dam 4 is a single-layer or multi-layer structure. In some embodiments of the present disclosure, the first blocking dam 4 may include a first layer 41 and a second layer 42.

The first layer 41 of the first blocking dam 4 can be provided on a surface of the dielectric layer 25 away from the substrate 1 and located in the edge area 203. The first layer 41 can cover an area of the power line 28 not covered by the lap layer 7 and a part of the lap layer 7. Further, the first layer 41 may be made of the same material as the pixel define layer 32 so that the first layer 41 and the pixel define layer 32 may be formed at the same time through the same patterning process.

The second layer 42 is provided on a surface of the first layer 41 away from the substrate 1. For example, the display panel according to embodiments of the present disclosure may further include a supporting pillar 9 (for example, the supporting pillar may be a photo spacer (PS)). The supporting pillar 9 may be provided on a surface of the pixel define layer 32 away from the substrate 1, and not shield the openings of the pixel define layer 32. The second layer 42 may be made of the same material as the supporting pillar 9, so that the second layer 42 and the supporting pillar 9 may be formed through the same patterning process to simplify the process. According to some embodiments, if the supporting pillar 9 and the pixel define layer 32 are made of the same material, the supporting pillar 9, the pixel define layer 32, the first layer 41 and the second layer 42 can be formed at the same time through a gray-tone mask or half-tone mask process.

As shown in FIG. 6 to FIG. 11, the flow guide strips 5 can be arranged on a side of the driving layer 2 in the edge area 203 away from the substrate 1, and extends from the edge area 203 to the peripheral circuit area 202. For example, the flow guide strips 5 may be provided on a surface of the dielectric layer 25 away from the substrate 1, and may cover at least a part of the power line 28, and extend from the edge area 203 to the surface of the lap layer 7 away from the substrate 1. Further, the flow guide strips 5 are located in the range surrounded by the first blocking dam 4, and the flow guide strips 5 are distributed at intervals along a ring trajectory, which can guide the organic material to flow to the first blocking dam 4 under the action of the capillary effect.

The flow guide strips 5 and the protective layer 8 can be made of the same material, so that the flow guide strips 5 and the protective layer 8 can be formed at the same time through the same patterning process to simplify the process. According to some other embodiments, the flow guide strips 5 can also be made of the same material as the supporting pillar 9 or the pixel define layer 32, so that the flow guide strips 5 can be formed at the same time as the supporting pillar 9 or the pixel define layer 32. If the material of the protective layer 8 is the same as the pixel define layer 32, the flow guide strips 5 can be formed simultaneously with the protective layer 8 and the pixel define layer 32. According to some other embodiments, the flow guide strips 5 and the first layer 41 of the first blocking dam 4 can be made of the same material and formed at the same time.

Figure 7:
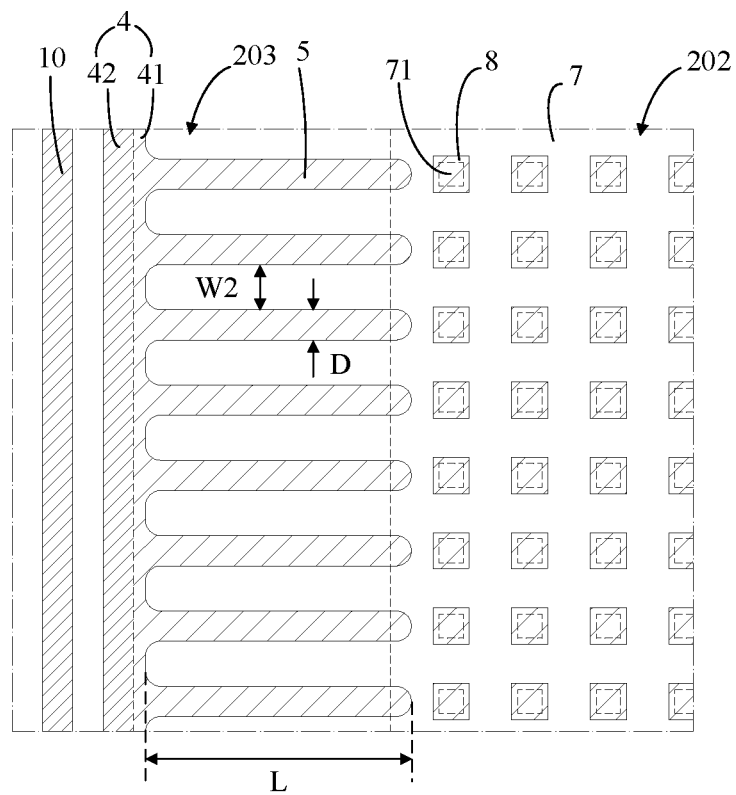
FIG. 7 is a schematic diagram showing the distribution of flow guide strips corresponding to the embodiment of the display panel in FIG. 6.

In some embodiments of the present disclosure, as shown in FIGS. 6 and 7, the flow guide strips 5 are connected to the inner side wall of the first blocking dam 4, and may be an integrated structure. That is, one end of each flow guide strip 5 is connected to the inner side wall of the first blocking dam 4, and the other end of each flow guide strip 5 extends toward the pixel driving area 201. In addition, in the direction perpendicular to the substrate 1, the thickness of each of flow guide bar 5 is smaller than the thickness of the first blocking dam 4.

Further, the inner side wall of the second layer 42 of the first blocking dam 4 surrounds the inner side wall of the first layer 41 and is outside more than the inner side wall of the first layer 41. That is, the inner side wall of the second layer 42 of the first blocking dam 4 is on a side of the inner side wall of the first layer 41 away from the pixel circuit area 201, the second layer 42 exposes a part of the first layer 41 to form a step. The flow guide strips 5 are connected to the first layer 41, which is beneficial for blocking the organic material of the encapsulation layer 6 at the inner side of the first blocking dam 4. Further, the flow guide strips 5 are made of the same material as the first layer 41, so that the flow guide strips 5 can be formed at the same time as the first layer 41.

Further, a distance K between the inner side wall of the second layer 42 and the inner side wall of the first layer 41 is not smaller than 3 µm, so that the organic material cannot easily overflow across the first blocking dam 4. In addition, the flow guide strips 5 may extend in a straight line toward the pixel driving area 201, the length L of each flow guide strip 5 is 50 µm-500 µm, the width D of each flow guide strip 5 is 5 µm-50 µm; the distance W2 between two adjacent flow guide strips 5 may be 5 µm-100 µm. The width of each flow guide strip 5 is the distance between two side walls of the flow guide strip 5. The distance between two adjacent flow guide strips 5 is the width of the gap between the two adjacent flow guide strips 5.

Figure 9:
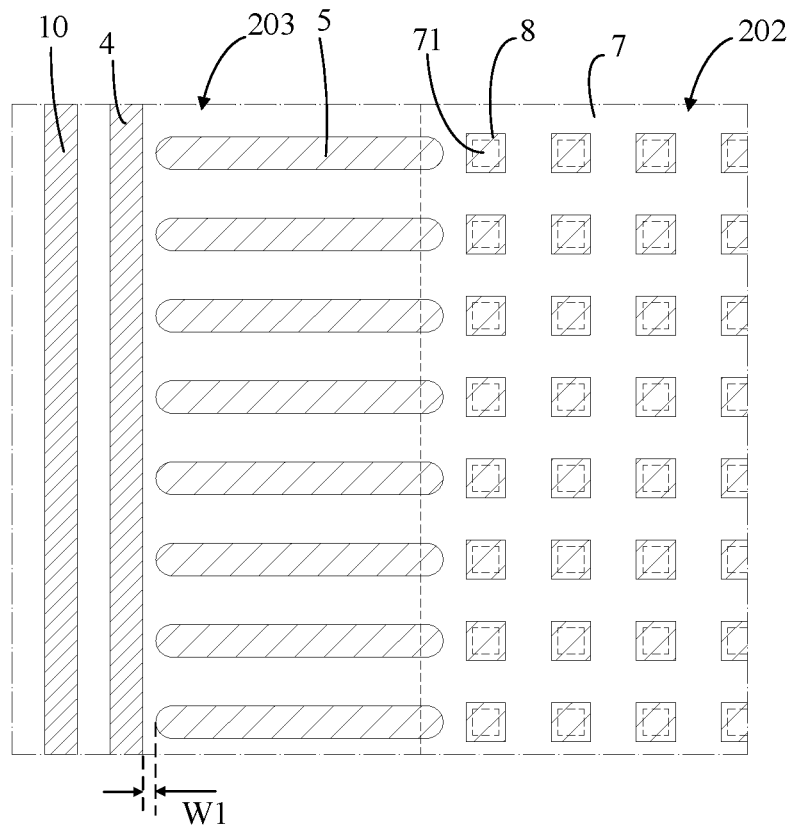
FIG. 9 is a schematic diagram showing the distribution of flow guide strips corresponding to the embodiment of the display panel in FIG. 8.

In some other embodiments of the present disclosure, as shown in FIGS. 8 and 9, there is a gap between the inner side wall of the first blocking dam 4 and the flow guide strips 5, which can prevent the organic material of the encapsulation layer 6 from overflowing across the first blocking dam 4. The gap between the inner side wall of the first blocking dam 4 and the flow guide strip 5 means: a gap between an end of the orthographic projection of each flow guide strips on the substrate 1 close to the first blocking dam 4, and the orthographic projection of the first blocking dam 4 on the substrate 1. Further, the width W1 of the gap between each flow guide strip 5 and the inner side wall of the first blocking dam 4 may be 3 µm-30 µm.

Figure 11:
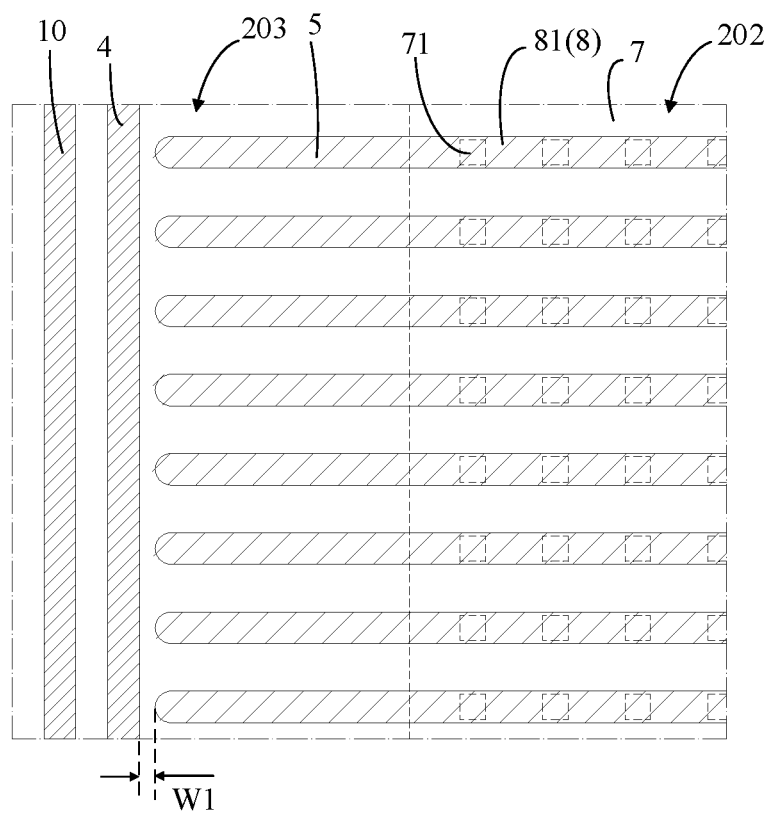
FIG. 11 is a schematic diagram showing the distribution of flow guide strips corresponding to the embodiment of the display panel in FIG. 10.

In still other embodiments of the present disclosure, as shown in FIGS. 10 and 11, the protective layer 8 includes a plurality of protective strips 81, and the vent holes 71 are distributed in the area of the lapping layer 7 covered by the protective strip 81. For example, the vent holes 71 may be distributed in an array, and each protective strip 81 may cover a row of vent holes 71. The protective strips 81 are connected to corresponding flow guide strips 5 in a one-to-one correspondence, so that the path for guiding the organic material to flow to the first blocking dam 4 can be extended. Each of the protective strips 81 and a corresponding flow guide strip 5 can be an integral structure and have the same width, and they can be formed at the same time through the same patterning process. That is, the protective strip 81 can be regarded as at least part of the drain strip 5 which extends toward the pixel circuit area 201 and is formed as a strip-shaped structure, as long as the protective strip can serve to corresponding vent holes 71.

In the embodiments shown in FIG. 9 and FIG. 10, there is a gap between the flow guide strips 5 and the inner side wall of the first blocking dam 4. According to some other embodiments, the flow guide strips 5 can be connected with the inner side wall of the first blocking dam 4.

Figure 4:
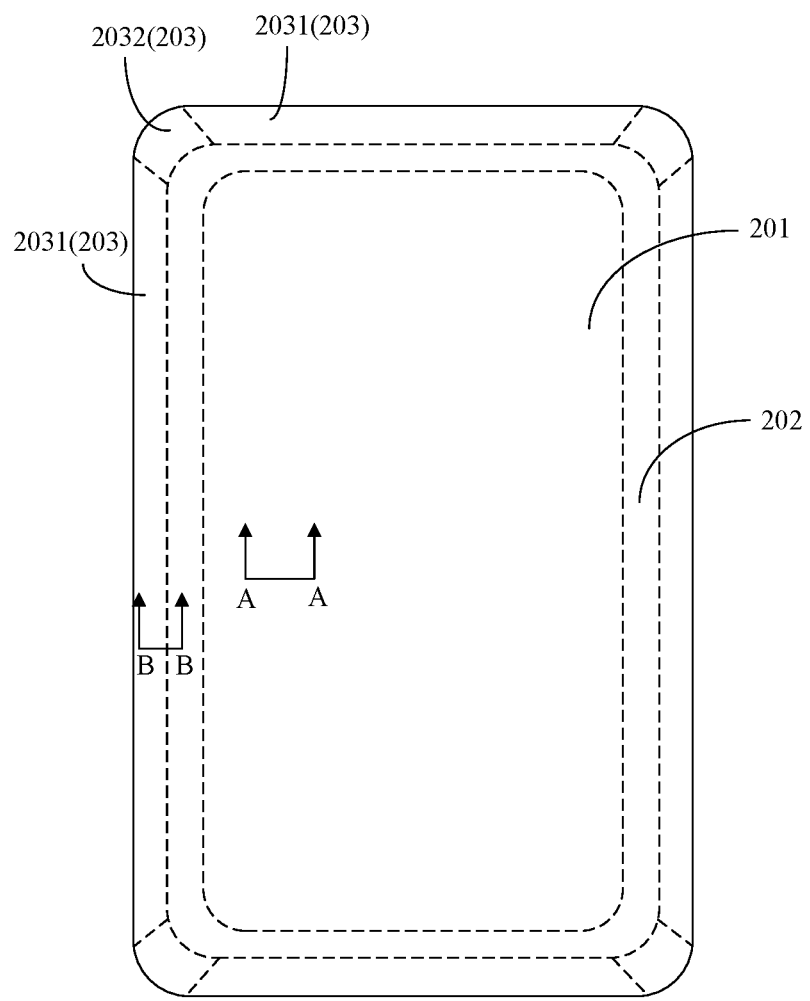
FIG. 4 is a top view of the display panel according to an embodiment of the present disclosure.
Figure 12:
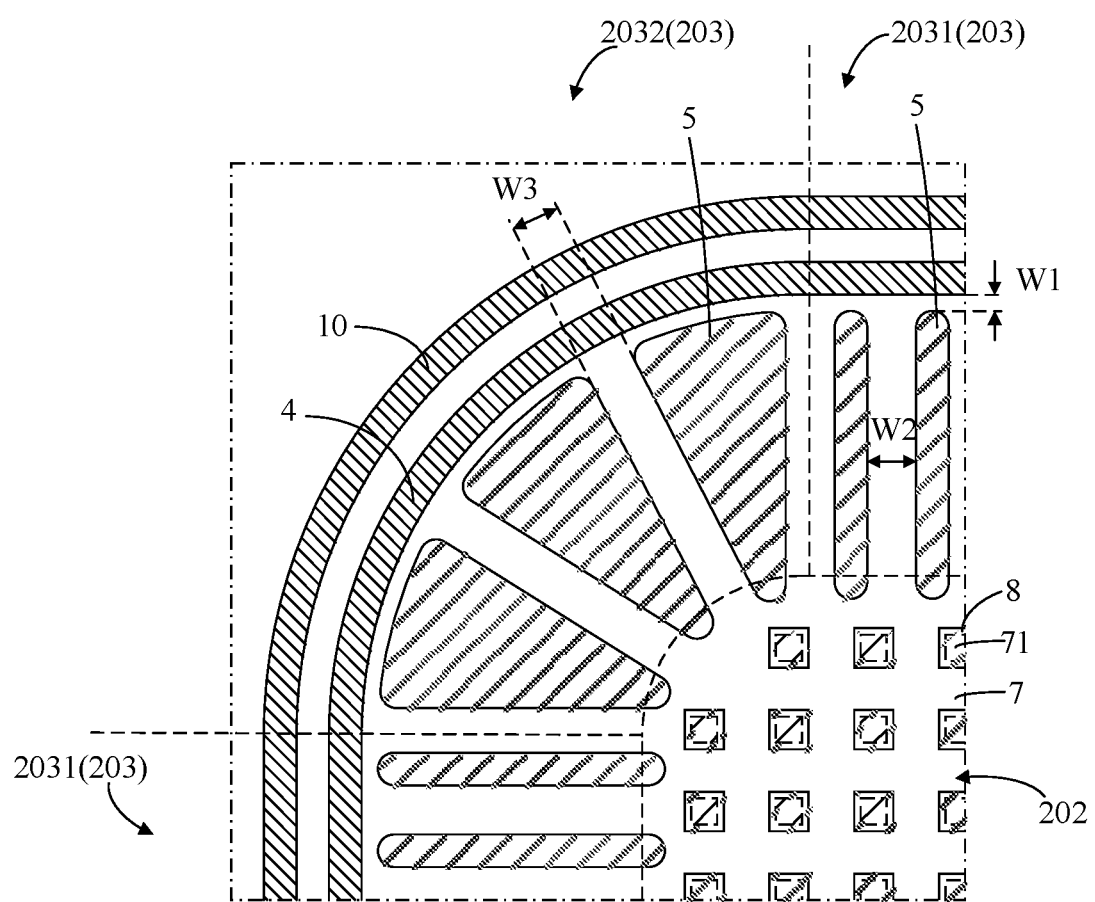
FIG. 12 is a schematic diagram showing the distribution of the flow guide strips in side areas and arc areas of the display panel according to an embodiment of the present disclosure.

In some embodiments of the present disclosure, as shown in FIGS. 4 and 12, the orthographic projection of the edge area 203 on the substrate 1 is a polygon, and the edge area 203 may include a plurality of side areas 2301 and arc areas 2032, and two adjacent side areas 2031 are connected by an arc-shaped area 2032. Correspondingly, the shape of the display panel is a rectangle with four arc-shaped corners. The first blocking dam 4 connects the side areas 2031 and the arc areas 2032 in series, and each side area 2031 and the arc area 2032 are provided with flow guide strips 5.

In the arc areas 2032, when the organic material used to form the organic layer 62 of the encapsulation layer 6 flows outward, the organic material needs to diffuse to both sides, and thus the region to be filled gradually increases as the organic material moves outward, but the amount of organic material is not increased as compared with the side area 2031, and accordingly the flow distance of the organic material in the arc areas 2032 is not enough. In view of this, the flow guide strips 5 located in the arc areas 2032 may have a width which is be increased along the direction away from the pixel circuit area 201, so that the flow guide strips 5 in the arc areas 2032 have a fan-shaped structure that expands in the direction away from the pixel circuit area 201. In this way, the area of the region to be filled is reduced, the organic material in the arc areas 2032 can flow to contact with the first blocking dam 4, avoiding insufficient coverage, improving the light emission uniformity at the corners of the display panel, and reducing process risks.

Further, the side walls of the flow guide strips 5 on both sides of the gap between the two adjacent flow guide strips 5 in the arc areas 2032 are parallel, so that the orthographic projection of the gap between the two adjacent flow guide strips 5 in the arc areas 2032 on the substrate 1 is a rectangle. The distance W3 between two adjacent flow guide strips 5 in the arc areas 2032 may be not greater than the distance W2 between two adjacent flow guide strips 5 in the side areas 2031, so that the to-be-filled region between two adjacent flow guide strips 5 in the arc areas 2032 is not larger than the to-be-filled region between two adjacent flow guide strips 5 in the side areas 2031.

In the embodiment shown in FIG. 12, there is a gap between the flow guide strips 5 and the inner side wall of the first blocking dam 4. According to some other embodiments, the flow guide strips 5 can be connected with the inner side wall of the first blocking dam 4.

As shown in FIGS. 6 to 12, the encapsulation layer 6 includes a first inorganic layer 61, an organic layer 62, and a second inorganic layer 63.

The first inorganic layer 61 covers the light-emitting device layer 3, the first blocking dam 4 and the flow guide strips 5. The thickness of the first inorganic layer 61 is smaller than that of the flow guide strips 5, and conforms to the first blocking dam 4 and the flow guide strips 5, namely, the first inorganic layer 61 protrudes in an area corresponding to the first blocking dam 4 and the flow guide bars 5.

The organic layer 62 is provided on a surface of the first inorganic layer 61 away from the substrate 1 and is limited to the range surrounded by the first blocking dam 4. The organic material can be printed on a surface of the first inorganic layer 61 away from the substrate 1 by inkjet printing, so as to obtain the organic layer 62. During this procedure, the protrusions of the first inorganic layer 61 corresponding to the flow guide strips 5 can produce capillary effect, thereby guiding the organic material to flow to the first blocking dam 4, avoiding insufficient coverage and overflow of the organic layer 62.

The second inorganic layer 63 may cover the organic layer 62 and the first inorganic layer 61 so as to enclose the organic layer 62 between the first inorganic layer 61 and the second inorganic layer 63. The boundary of the orthographic projection of the first inorganic layer 61 and the second inorganic layer 63 on the substrate 1 coincides with the boundary of the substrate 1 and can be used to block water. The organic layer 62 is used to flatten the interface, cover defects, and relieve stress.

As shown in FIGS. 6-12, the display panel further includes a second blocking dam 10, which is provided on a side of the edge area 203 away from the substrate 1, for example, on a surface of the dielectric layer 25 away from the substrate 1. Further, the second blocking dam 10 is arranged around the first blocking dam 4, and the first inorganic layer 61 covers the second blocking dam 10.

In some embodiments of the present disclosure, as shown in FIGS. 6, 8 and 10, the second blocking dam 10 may cover a part of the power line 28. For example, the second blocking dam 10 can cover an edge of a side of the power line 28 away from the pixel circuit area 201, can cover the burrs on the edge of the power line 28 and prevent the power line 28 from warping.

The second blocking dam 10 may be a single-layer or multi-layer structure. In some embodiments of the present disclosure, the height of the second blocking dam 10 may be greater than that of the first blocking dam 4. The second blocking dam 10 may include a first layer 101, a second layer 102, and a third layer 103. The first layer 101 can be made of the same material as the planarization layer 27, and the first layer 101 and the planarization layer 27 can be formed by the same patterning process. The second layer 102 can be made of the same material as the pixel define layer 32, and the second layer 102 and the pixel define layer 32 can be formed at the same time through the same patterning process. The third layer 103 can be made of the same material as the supporting pillar 9, and third layer 103 and the supporting pillar 9 can be formed at the same time through the same patterning process. In addition, an edge of the lap layer 7 away from the pixel circuit area 201 can extend between the first layer 101 and the second layer 102 to prevent the lap layer 7 from warping, and the first layer 101 can be protected by the lap layer 7, to prevent the first layer 101 and the dielectric layer 25 from peeling off during other processes after the first layer 101 is formed.

Figure 13:
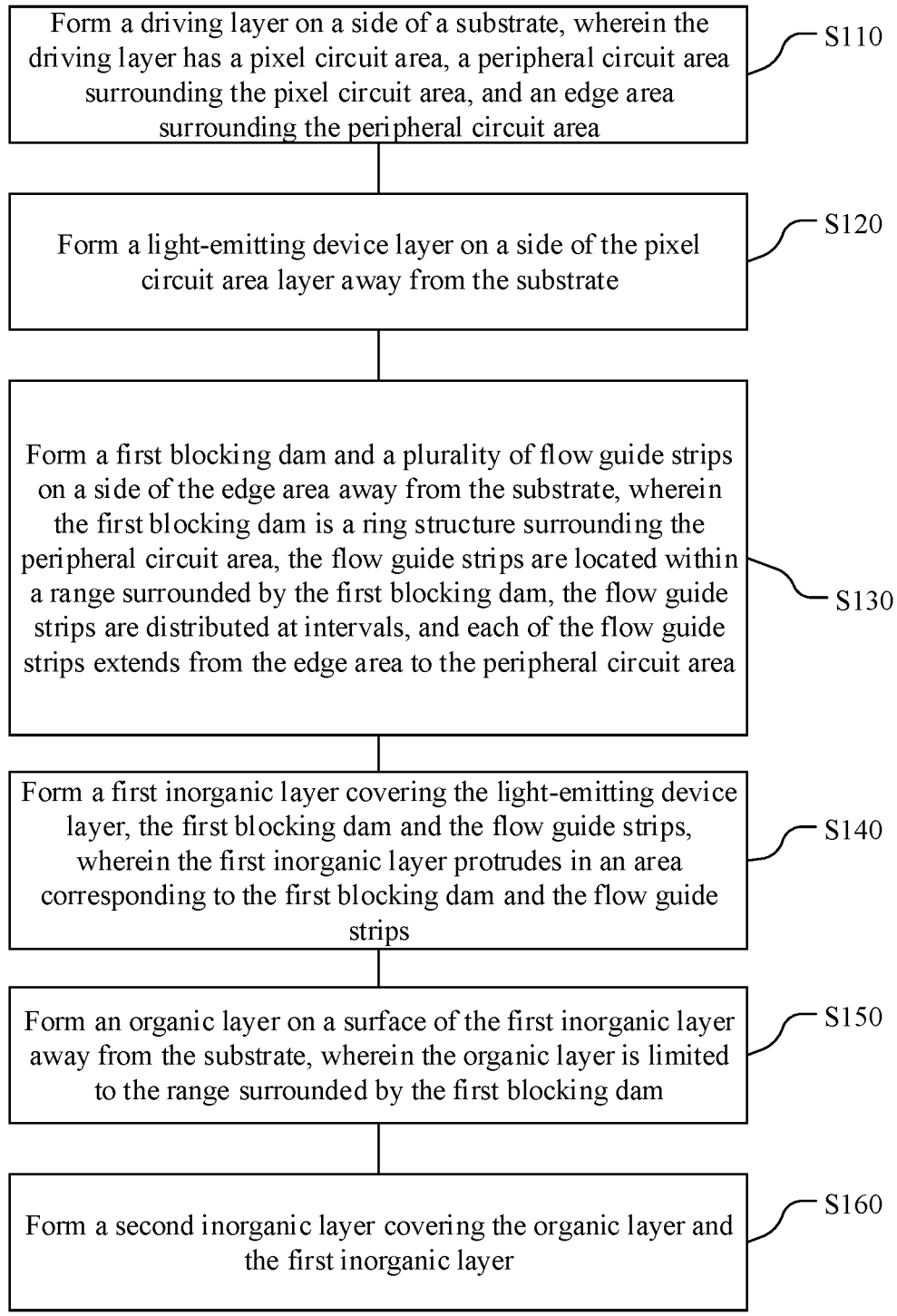
FIG. 13 is a flowchart of a manufacturing method according to an embodiment of the present disclosure.

An embodiment of the present disclosure further provides a method for manufacturing a display panel. The display panel may be the display panel of any of the above-mentioned embodiments, and the specific structure of the display panel can be found in the above-mentioned embodiments of the display panel, which will not be described in detail here. As shown in FIG. 13, the manufacturing method may include step S110-step S160.

In step S110, a driving layer is formed on a side of a substrate. The driving layer has a pixel circuit area, a peripheral circuit area surrounding the pixel circuit area, and an edge area surrounding the peripheral circuit area.

In step S120, a light-emitting device layer is formed on a side of the pixel circuit area layer away from the substrate.

In step S130, a first blocking dam and a plurality of flow guide strips are formed on a side of the edge area away from the substrate. The first blocking dam is a ring structure surrounding the peripheral circuit area. The flow guide strips are located within the range surrounded by the first blocking dam. The flow guide strips are distributed at intervals, and each of the flow guide strips extends from the edge area to the peripheral circuit area.

In step S140, a first inorganic layer covering the light-emitting device layer, the first blocking dam and the flow guide strips is formed. The first inorganic layer protrudes in an area corresponding to the first blocking dam and the flow guide strips.

In step S150, an organic layer is formed on a surface of the first inorganic layer away from the substrate. The organic layer is limited to the range surrounded by the first blocking dam.

In step S160, a second inorganic layer covering the organic layer and the first inorganic layer is formed.

The details of the structure corresponding to each step of the manufacturing method according to the embodiment of the present disclosure have been described in the above embodiments of the display panel, and will not be repeated here.

An embodiment of the present disclosure further provides a display device, which may include the display panel of any of the above-mentioned embodiments. The structure of the display panel can be found in the above-mentioned embodiments, and the specific structure and beneficial effects are not repeated here. The display device according to embodiments of the present disclosure may be an electronic device with a display function, such as a mobile phone, a tablet computer, or a television, which will not be listed here.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are exemplary, and the scope and spirit of the present disclosure are defined by the appended claims.

What is claimed is:

1. A display panel, comprising:
a substrate;
a driving layer arranged on a side of the substrate, and having a pixel circuit area, a peripheral circuit area surrounding the pixel circuit area, and an edge area surrounding the peripheral circuit area;
a light-emitting device layer arranged on a side of the pixel circuit area away from the substrate;
a first blocking dam arranged on a side of the edge area away from the substrate, the first blocking dam being a ring structure surrounding the peripheral circuit area;
a plurality of flow guide strips arranged on a side of the edge area away from the substrate and located in a range surrounded by the first blocking dam, wherein the plurality of flow guide strips are distributed at intervals, and each of the flow guide strips extends from the edge area to the peripheral circuit area; and
an encapsulation layer comprising a first inorganic layer, an organic layer and a second inorganic layer, wherein:
the first inorganic layer covers the light-emitting device layer, the first blocking dam and the flow guide strips, and protrudes at an area corresponding to the first blocking dam and the flow guide strips;
the organic layer is provided on a surface of the first inorganic layer away from the substrate, and is defined in the range surrounded by the first blocking dam; and
the second inorganic layer covers the organic layer and the first inorganic layer;
wherein an orthographic projection of the edge area on the substrate is a polygon, and the edge area comprises a plurality of side areas and arc areas, and two adjacent side areas are connected by one of the arc areas; and wherein flow guide strips located in the arc areas have a width which is increased along a direction away from the pixel circuit area;

wherein the display panel further comprises:

a lap layer arranged on a surface of a planarization layer away from the substrate and extending to a surface of a power line away from the substrate, wherein an area of the lap layer corresponding to the planarization layer is provided with a plurality of vent holes distributed in an array, and a material and a thickness of the lap layer are the same as a material and a thickness of a first electrode layer comprised in the light-emitting device layer, respectively; and a protective layer arranged on a surface of the lap layer away from the substrate, covering the vent holes, and exposing a part of the lap layer, wherein a material and a thickness of the protective layer are the same as a material and a thickness of the flow guide strips, respectively;

wherein the flow guide strips are located on a side of the protective layer away from the pixel circuit area, and cover a part of the lap layer corresponding to the power line; and wherein a second electrode layer, which is comprised in the light-emitting device layer, extends toward the edge area to a surface of the protective layer away from the substrate, and is connected to the lap layer.

2. The display panel according to claim 1, wherein the flow guide strips are connected to an inner side wall of the first blocking dam, and a thickness of each of the flow guide strips is smaller than a thickness of the first blocking dam in a direction perpendicular to the substrate.

3. The display panel according to claim 2, wherein the first blocking dam comprises a first layer and a second layer sequentially stacked in a direction away from the substrate, an inner sidewall of the second layer surrounds is outward more than the inner side wall of the first layer, the second layer exposes a part of the first layer to form a step, and the flow guide strips are connected with the first layer and a material of the flow guide stripes is the same as a material of the first layer.

4. The display panel according to claim 1, wherein there is a gap between an inner side wall of the first blocking dam and the flow guide strips.

5. The display panel according to claim 3, wherein a distance between an inner side wall of the second layer and an inner side wall of the first layer is not smaller than 3 µm.

6. The display panel according to claim 4, wherein a width of the gap between the inner side wall of the first blocking dam and the flow guide strips is 3 µm-30 µm.

7. The display panel according to claim 1, wherein the flow guide strips located in the arc areas are fan-shaped.

8. The display panel according to claim 1, wherein the driving layer comprises:

an active layer provided on a side of the substrate and located in the pixel circuit area and the peripheral circuit area;

a first gate insulating layer covering the active layer and located in the pixel circuit area, the peripheral circuit area and the edge area;

a gate electrode layer provided on a surface of the first gate insulating layer away from the substrate, and located in the pixel circuit area and the peripheral circuit area;

a second gate insulating layer covering the gate electrode layer and the first gate insulating layer and located in the pixel circuit area, the peripheral circuit area and the edge area;

a dielectric layer covering the second gate insulating layer and located in the pixel circuit area, the peripheral circuit area and the edge area;

a source and drain layer provided on a surface of the dielectric layer away from the substrate and located in the pixel circuit area and the peripheral circuit area;

the planarization layer covering the source and drain layer and the dielectric layer, and located in the pixel circuit area and the peripheral circuit area;

the power line provided on a surface of the dielectric layer away from the substrate and located in the edge area, wherein a material and a thickness of the power line are the same as a material and a thickness of the source and drain layer, respectively;

wherein the first blocking dam and the flow guide strips cover at least a part of the power line.

9. The display panel according to claim 8, wherein the light-emitting device layer comprises:

the first electrode layer arranged on a surface of the planarization layer away from the substrate and located in the pixel circuit area, wherein the first electrode layer comprises a plurality of first electrodes distributed in an array;

a pixel define layer covering the first electrode layer and the planarization layer, and exposing each of the first electrodes;

a light-emitting functional layer covering at least surfaces of the first electrodes away from the substrate; and the second electrode layer covering the light-emitting functional layer.

10. The display panel according to claim 1, wherein the protective layer comprises a plurality of protective strips, the vent holes are distributed in an area where the lap layer is covered by the protective strips, and the protective strips are connected to the flow guide strips in a one-to-one correspondence.

11. The display panel according to claim 1, further comprising:

a supporting pillar arranged on a surface of the pixel define layer away from the substrate;

wherein one of the supporting pillar and the pixel define layer is made of a same material as the flow guide strips.

12. The display panel according to claim 1, further comprising a second blocking dam arranged on a side of the edge area away from the substrate and arranged around the first blocking dam, wherein the first inorganic layer covers the second blocking dam.

13. The display panel according to claim 12, wherein:

the second blocking dam comprises a first layer, a second layer and a third layer sequentially stacked along a direction away from the substrate; and an edge of the lap layer away from the pixel circuit area extends to an area between the first layer and the second layer.

14. The display panel according to claim 1, wherein a length of each of the flow guide strips is 50 µm-500 µm, a width of each of the flow guide strips is 5 µm-50 µm, and a distance between two adjacent flow guide strips is 5 µm-100 µm.

15. The display panel according to claim 1, wherein the flow guide strips are distributed at intervals along a ring trajectory.

16. A display device comprising a display panel, wherein the display panel comprises:
a substrate;
a driving layer arranged on a side of the substrate, and having a pixel circuit area, a peripheral circuit area surrounding the pixel circuit area, and an edge area surrounding the peripheral circuit area;
a light-emitting device layer arranged on a side of the pixel circuit area away from the substrate;
a first blocking dam arranged on a side of the edge area away from the substrate, the first blocking dam being a ring structure surrounding the peripheral circuit area;
a plurality of flow guide strips arranged on a side of the edge area away from the substrate and located in a range surrounded by the first blocking dam, wherein the plurality of flow guide strips are distributed at intervals, and each of the flow guide strips extends from the edge area to the peripheral circuit area; and
an encapsulation layer comprising a first inorganic layer, an organic layer and a second inorganic layer, wherein:
the first inorganic layer covers the light-emitting device layer, the first blocking dam and the flow guide strips, and protrudes at an area corresponding to the first blocking dam and the flow guide strips;
the organic layer is provided on a surface of the first inorganic layer away from the substrate, and is defined in the range surrounded by the first blocking dam; and
the second inorganic layer covers the organic layer and the first inorganic layer;
wherein an orthographic projection of the edge area on the substrate is a polygon, and the edge area comprises a plurality of side areas and arc areas, and two adjacent side areas are connected by one of the arc areas; and
wherein flow guide strips located in the arc areas have a width which is increased along a direction away from the pixel circuit area;
wherein the display panel further comprises:
a lap layer arranged on a surface of a planarization layer away from the substrate and extending to a surface of a power line away from the substrate, wherein an area of the lap layer corresponding to the planarization layer is provided with a plurality of vent holes distributed in an array, and a material and a thickness of the lap layer are the same as a material and a thickness of a first electrode layer comprised in the light-emitting device layer respectively; and
a protective layer arranged on a surface of the lap layer away from the substrate, covering the vent holes, and exposing a part of the lap layer, wherein a material and a thickness of the protective layer are the same as a material and a thickness of the flow guide strips, respectively;
wherein the flow guide strips are located on a side of the protective layer away from the pixel circuit area, and cover a part of the lap layer corresponding to the power line; and
wherein a second electrode layer, which is comprised in the light-emitting device layer, extends toward the edge area to a surface of the protective layer away from the substrate, and is connected to the lap layer.

17. The display device according to claim 16, wherein the flow guide strips are connected to an inner side wall of the first blocking dam, and a thickness of each of the flow guide strips is smaller than a thickness of the first blocking dam in a direction perpendicular to the substrate.

18. A method for manufacturing a display panel, comprising:
forming a driving layer on a side of a substrate, wherein the driving layer has a pixel circuit area, a peripheral circuit area surrounding the pixel circuit area, and an edge area surrounding the peripheral circuit area;
forming a light-emitting device layer on a side of the pixel circuit area layer away from the substrate;
forming a first blocking dam and a plurality of flow guide strips on a side of the edge area away from the substrate, wherein the first blocking dam is a ring structure surrounding the peripheral circuit area, the flow guide strips are located within a range surrounded by the first blocking dam, the flow guide strips are distributed at intervals, and each of the flow guide strips extends from the edge area to the peripheral circuit area;
forming a first inorganic layer covering the light-emitting device layer, the first blocking dam and the flow guide strips, wherein the first inorganic layer protrudes in an area corresponding to the first blocking dam and the flow guide strips;
forming an organic layer on a surface of the first inorganic layer away from the substrate, wherein the organic layer is limited to the range surrounded by the first blocking dam; and
forming a second inorganic layer covering the organic layer and the first inorganic layer;
wherein an orthographic projection of the edge area on the substrate is a polygon, and the edge area comprises a plurality of side areas and arc areas, and two adjacent side areas are connected by one of the arc areas; and
wherein flow guide strips located in the arc areas have a width which is increased along a direction away from the pixel circuit area;
wherein the display panel further comprises:
a lap layer arranged on a surface of a planarization layer away from the substrate and extending to a surface of a power line away from the substrate, wherein an area of the lap layer corresponding to the planarization layer is provided with a plurality of vent holes distributed in an array, and a material and a thickness of the lap layer are the same as a material and a thickness of a first electrode layer comprised in the light-emitting device layer, respectively; and
a protective layer arranged on a surface of the lap layer away from the substrate, covering the vent holes, and exposing a part of the lap layer, wherein a material and a thickness of the protective layer are the same as a material and a thickness of the flow guide strips, respectively;
wherein the flow guide strips are located on a side of the protective layer away from the pixel circuit area, and cover a part of the lap layer corresponding to the power line; and
wherein a second electrode layer, which is comprised in the light-emitting device layer, extends toward the edge area to a surface of the protective layer away from the substrate, and is connected to the lap layer.

* * * * *